(12) United States Patent
Zeng et al.

(10) Patent No.: US 7,714,430 B2
(45) Date of Patent: May 11, 2010

(54) SUBSTRATE WITH LOSSY MATERIAL INSERT

(75) Inventors: Xiang Yin Zeng, Shanghai (CN); Daoqiang (Daniel) Lu, Chandler, AZ (US); Jiangqi He, Gilbert, AZ (US); Jiamiao(John) Tang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 412 days.

(21) Appl. No.: 11/529,011

(22) Filed: Sep. 28, 2006

(65) Prior Publication Data

US 2008/0102565 A1 May 1, 2008

(51) Int. Cl.
*H01L 23/12* (2006.01)

(52) U.S. Cl. ............... 257/700; 257/698; 257/702; 257/703; 257/789; 257/795; 257/E23.067; 428/209; 174/250

(58) Field of Classification Search .......... 257/700, 257/698, 702, 703, 789, 795, E23.067; 428/209; 174/250

See application file for complete search history.

(56) References Cited

U.S. PATENT DOCUMENTS

| | | | |
|---|---|---|---|
| 5,428,506 A * | 6/1995 | Brown et al. ............. | 361/794 |
| 6,622,370 B1 * | 9/2003 | Sherman et al. .......... | 29/600 |
| 6,706,974 B2 * | 3/2004 | Chen et al. .............. | 174/261 |
| 6,798,666 B1 * | 9/2004 | Alexander et al. ........ | 361/766 |
| 6,833,615 B2 | 12/2004 | Geng et al. .............. | 257/698 |
| 6,924,551 B2 | 8/2005 | Rumer et al. ............. | 257/688 |
| 6,992,379 B2 * | 1/2006 | Alcoe et al. ............. | 257/700 |
| 7,001,782 B1 | 2/2006 | Diana et al. ............. | 438/3 |
| 7,059,049 B2 * | 6/2006 | Farquhar et al. .......... | 29/852 |
| 7,101,798 B2 | 9/2006 | Goodner et al. .......... | 438/689 |

OTHER PUBLICATIONS

Fang, Jiayuan, et al. "Shorting Via Arrays for the elimination of Package Resonance to Reduce Power Supply Noise in Multi-layered Area-Array IC Packages", pp. 1-8, www.sigrity.com/papers/ipdi98.
Shi, Jin, et al. "Efficient Early Stage Resonance Estimation Techniques for C4 Package" pp. 826-831 www.ee.ucr.edu/~stan/papers/aspdac06_pgsim.pdf#search=%22efficient%20early%20stage.
Du, Jin-Hong, et al. "Microwave electromagnetic Characteristics of a microcoiled carbon fibers/paraffin wax composite in Ku band", pp. 1232-1236, http://carbon.imr.ac.cn/literature/2002/JMR%20p1232-Dujh.pdf.

* cited by examiner

*Primary Examiner*—Jasmine J Clark
(74) *Attorney, Agent, or Firm*—Trop, Pruner & Hu, P.C.

(57) ABSTRACT

In one embodiment, the present invention includes a semiconductor package with lossy material inserts. The lossy material inserts may reduce electronic noise such as package resonance. Other embodiments are described and claimed.

18 Claims, 3 Drawing Sheets

SUBSTRATE WITH LOSSY MATERIAL INSERT

BACKGROUND

Embodiments of the present invention relate to integrated circuit (IC) package and printed circuit board (PCB) technologies. More particularly, the embodiments relate to lossy material inserts located in IC packages and PCB's.

Circuit designers continually pursue electronic circuits that run faster. Examples of such circuits are those with shorter rise times and fall times. These circuits may have an increased signal frequency spectrum that can be, for example, between 40 GHz and 50 GHz. Unfortunately, the increased frequency may result in increased levels of undesirable electronic noise, such as simultaneous switching noise and package resonance. This electronic noise can adversely affect signal integrity within the semiconductor substrate packaging or PCB.

Various mechanisms can cause electronic noise. For example, simultaneous switching noise can be caused when electronic switches (e.g., transistors) turn on or off simultaneously. The switching action may induce an electronic wave (e.g., propagation wave). The wave propagates to the edge of the semiconductor package and then reflects off the edge. This wave reflection results in a wave that resonates within the package, thereby creating a resonant circuit with a resonant frequency. The resonant frequency may interfere with other frequencies in the circuit. Furthermore, large input impedances may develop around the resonant frequency. These impedances can exacerbate noise issues such as package resonance. Thus, propagation wave excitation is one mechanism by which undesirable electronic noise (e.g., simultaneous switching noise and package resonance) can be created and adversely affect signal integrity.

Traditionally, designers have used decoupling capacitors to attempt to manage electronic noise such as package resonance. However, decoupling capacitors merely shift package resonance without reducing the resonance to any large degree. In addition, the capacitors can be expensive to implement and take up valuable space on the substrate (e.g., semiconductor package substrate, PCB). Thus, the use of decoupling capacitors to solve noise issues, such as simultaneous switching noise and package resonance, is less than ideal.

DETAILED DESCRIPTION

Figure 1:
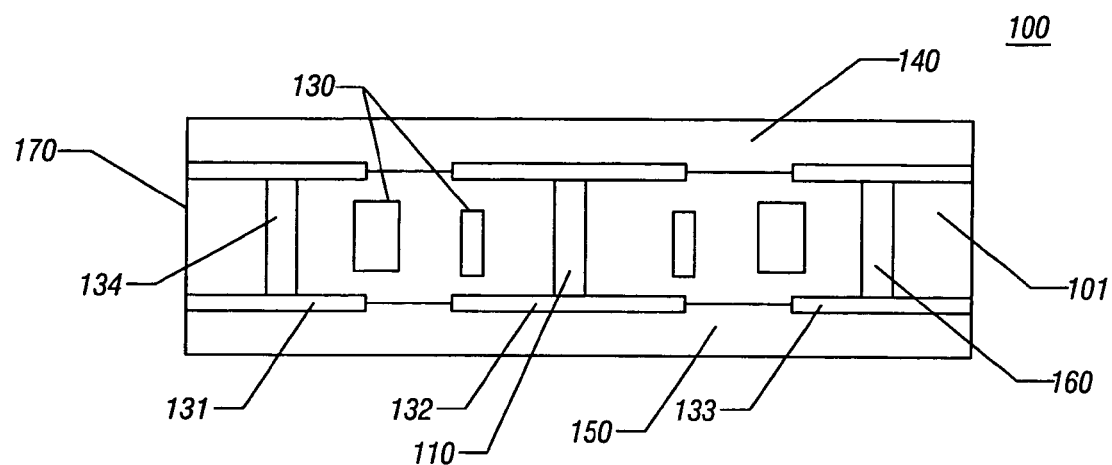
FIG. 1 is a cross-sectional view of a semiconductor package substrate in accordance with one embodiment of the present invention.

FIG. 1 is a cross-sectional view of a semiconductor package substrate 100 in accordance with one embodiment of the present invention. FIG. 1 shows a semiconductor package substrate core layer 101 which may be, for example, approximately 800 microns thick. Vias 110, 134, 160 may be used in several capacities. For example, via 110 may be used as a signal path and may be coupled to an input/output (I/O) plane 132 or trace. Via 110 may be a plated-through hole (PTH). Via 134 may also be a PTH and may be coupled to, for example, a ground plane 131. Via 160 may be a PTH for transmitting power through the substrate core layer 101 from, for example, power plane 133. Power plane 133 may be coupled to a supply voltage (not shown). In one embodiment of the invention, the vias 110, 160 are 50 to 60 microns thick. Lossy material inserts 130 may be located between vias 110, 134, 160 and encapsulated within substrate core layer 101. In one embodiment of the invention, a lossy material insert 130 may be 300 to 400 microns in diameter. As those of ordinary skill in the art will appreciate, the 300 to 400 micron diameter is not limited to inserts of circular cross-section and may apply to, for example, inserts with rectangular or ovular cross-sections. Lossy material inserts 130 may include one or more high lossy materials such as, for example, carbon or metal particle-filled dielectrics. The package may comprise additional layers 140, 150.

As signals (e.g., I/O, power) are transmitted through vias 110, 134, 160, electronic noise, such as package resonance, may be induced within the package. However, the lossy material inserts 130 may absorb much of the resonant energy and convert the energy into harmless levels of heat. More specifically, the lossy material inserts 130 may absorb the harmful electromagnetic energy of the noise and thereby decrease the noise. For example, when a propagation wave is induced and later reaches the semiconductor package 170 edge, the energy in the wave may be greatly reduced by the lossy inserts 130 and the corresponding reflected wave may also be very weak. The package "Q" value will decrease and the package resonance will be greatly reduced or even negated. This reduction may be due in part to, for example, the lossy material inserts' 130 effect of reducing input impedance and therefore, package resonance. While FIG. 1 shows lossy material inserts 130 in a columnar embodiment, those of ordinary skill in the art will appreciate that other embodiments of the invention may comprise lossy inserts that are, for example, spherical, ovular and/or planar.

Figure 2:
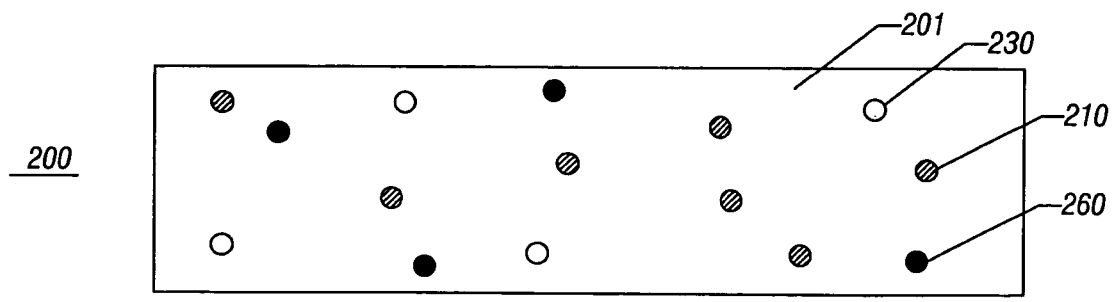
FIG. 2 is a top view of a semiconductor package in accordance with another embodiment of the present invention.

FIG. 2 is a top view of a semiconductor package 200 in accordance with another embodiment of the present invention. Vias 210 and 260 may be located in substrate 201. Vias 210, 260 may be PTH's and may be coupled to, for example, I/O signal, ground, and/or power traces or planes. Lossy material inserts 230 may be interspersed between vias 210, 260. The lossy material inserts 230 may be located within a substrate core layer or across several layers of a substrate.

Figure 3:
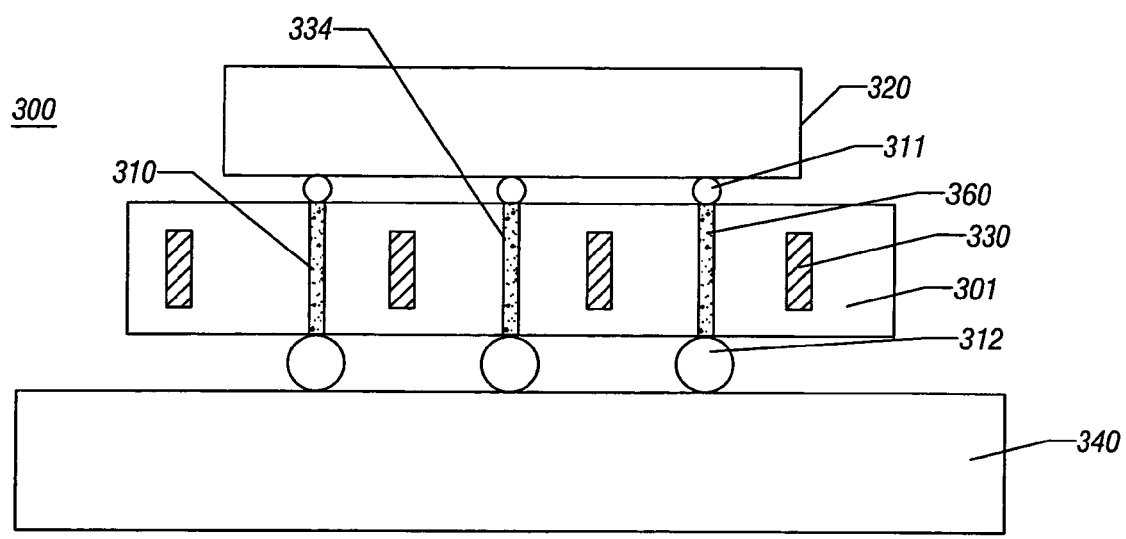
FIG. 3 is a cross-sectional view of a system in accordance with an embodiment of the present invention.

FIG. 3 is a cross-sectional view of a system 300 in accordance with yet another embodiment of the present invention. In FIG. 3, semiconductor package substrate 301 includes vias (e.g., PTH's) 310, 334, 360 as well as lossy material inserts 330. The vias 310, 334, 360, in cooperation with interconnects 311, 312 may couple semiconductor die 320 to motherboard 340.

Figure 4:
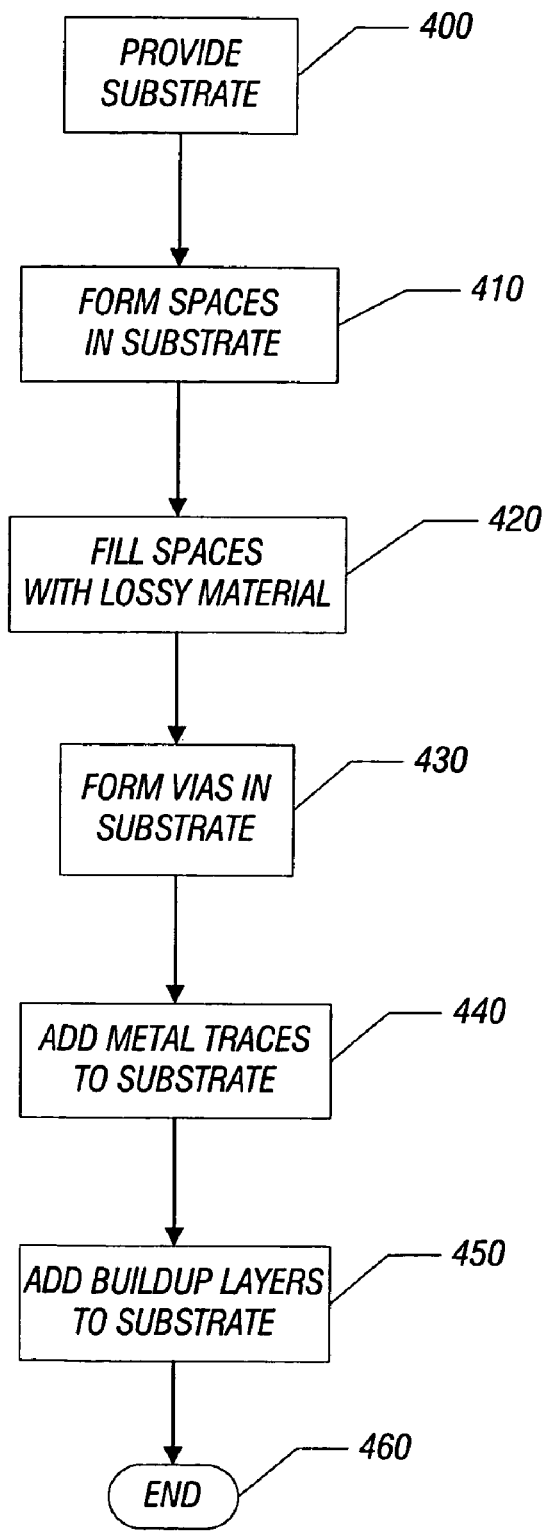
FIG. 4 is a flow diagram of a method of forming a semiconductor package in accordance with another embodiment of the invention.

FIG. 4 is a flow diagram of a method of forming a semiconductor package in accordance with an embodiment of the invention. In block 400, a substrate core layer is fabricated, provided or received. The substrate core layer may be, for example, an organic laminate with copper foil on both sides.

In block 410, spaces are formed in the substrate. In one embodiment of the invention, a drilling (e.g., mechanical drilling, laser drilling) process may be used to form the spaces. In one embodiment of the invention, the designated areas for spaces are not areas designated for future placement of vias such as PTH's (e.g., signal, ground, power). In an embodiment of the invention, the spaces can be approximately 300 to 400 microns in diameter. The spaces may be drilled through the top copper layer and into the organic laminate in the core.

In block 420, a lossy material (e.g., carbon) can be deposited within the space or spaces described in block 410. The lossy material may be deposited or inserted into the spaces using stencil printing techniques or other common techniques known to persons of ordinary skill in the art (e.g., lamination). The lossy material may include carbon. However, those of ordinary skill in the art will appreciate that other suitable lossy materials include, for example, an insulating material (e.g., epoxy) embedded with metal particles such as, for example, cobalt (Co), chromium (Cr), iron (Fe), tin (Sn), copper (Cu), silver (Ag), gold (Au), palladium (Pd), platinum (Pt), ruthenium (Ru), rhodium (Rh), iridium (Ir), and osmium (Os), combinations thereof and alloys thereof. As mentioned above, in some embodiments of the invention the spaces may be formed within only the substrate core layer. After such spaces are filled or substantially filled with a lossy material, the space may be encapsulated or sealed using, for example, a dielectric material (e.g., epoxy). In other words, the lossy inserts may be encapsulated within the substrate core layer and not in contact with, for example, any metal layer or trace. Thus, the encapsulated insert is directly connected to only one layer of the substrate. Of course, lossy inserts may be located in substrate layers other than the substrate core layer. In some embodiments of the invention, the lossy insert or inserts may be located in more than one layer of the substrate.

In block 430, vias may be formed in the substrate core layer. The vias may be formed by mechanical drilling. In one embodiment of the invention, the vias may be located in areas separate and apart from the lossy inserts. For example, signal vias may be located with a lossy insert substantially between them. Locating the lossy insert near, for example, I/O signal PTH's may help reduce the electronic noise (e.g., noise coupling, simultaneous switching noise, package resonance) that may be emitted from these vias. As those of ordinary skill in the art will appreciate, a lossy insert located between, for example, two vias need not be arranged with the two vias in a linear fashion to achieve electronic noise reduction. Furthermore, in some embodiments of the invention, the lossy insert may be substantially parallel to the signal vias and/or power vias. In other words, the longest axis of the lossy insert and vias may be parallel to each other.

Still referring to block 430, the vias can be approximately 100 to 300 microns in diameter in an embodiment of the invention. A metal (e.g., copper) can be deposited onto the inner walls of any via through a plating process, thereby creating a PTH via. In one embodiment of the invention, the metal is copper (Cu) and is deposited in, for example, a power via using techniques known to those of ordinary skill in the art (e.g., sputtering, electroplating, electroless plating). Those of ordinary skill in the art will appreciate that other suitable metals include, for example, nickel (Ni), cobalt (Co), chromium (Cr), iron (Fe), tin (Sn), silver (Ag), gold (Au), palladium (Pd), platinum (Pt), ruthenium (Ru), rhodium (Rh), iridium (Ir), and osmium (Os), their alloys and metal alloys with metalloids such as phosphorus (P), boron (B), nitrogen (N), and silicon (Si). In one embodiment of the invention, no PTH is located in direct connection with any lossy material insert. In one embodiment of the invention, the PTH's are filled with an insulating material or a conductive material such as copper paste.

In block 440, the copper layers on the top and bottom of the core may be selectively etched to form copper traces to transmit power and signals. A photoresist layer may be deposited on the copper layers and then defined using lithography known to those of ordinary skill in the art. In one embodiment of the invention, the photoresist is defined such that the photoresist is only left on the areas where copper traces will be formed. A chemical etching process may then be used to etch away the copper, which is not covered by the photoresist. After copper traces are formed, the photoresist is removed.

In block 450, buildup layers may be added to the substrate using techniques known to those of ordinary skilled in the art. The buildup layers may include dielectric layers (e.g., FR4) that are, for example, 20 to 30 microns thick and metal layers which consist of metal traces. The metal may be copper in one embodiment of the invention. However, other metals such as aluminum (Al), gold (Au), silver (Ag), nickel (Ni), cobalt (Co), platinum (Pt), palladium (Pd) and their alloys may be used as the metal layer. The metal layers may have a thickness of, for example, 10 to 30 microns. Different metal layers may be connected through micro-vias which are formed using lithography or laser drilling followed by metal plating. In block 460, the method of forming the semiconductor package ends.

During operation of such a package, the metal layers and power PTH's, as described in blocks 430, 440 of FIG. 4, may be connected to a power source. Signal PTH's, described in block 430 of FIG. 4, may also be connected to, for example, I/O signal sources. Ground PTH's, also described in block 430 of FIG. 4, may also be connected to, for example, a ground plate or plates. Power may be transmitted through the power PTH's and I/O signals may be transmitted via the signal PTH's, thereby creating electronic noise (e.g., package resonance, noise coupling, simultaneous switching noise). The lossy inserts may act to suppress or eliminate electronic noise emanating from power, ground and signal PTH's or elsewhere in the environment near the semiconductor package.

While FIGS. 1, 2, 3 and 4 discuss semiconductor package substrates in particular, those of ordinary skill in the art will appreciate that the invention is not limited to these particular embodiments. For example, the lossy material inserts may be implemented in other substrates, such as a PCB. The effect of the lossy material inserts can have the same or similar benefits in these other substrates. For example, electronic noise (e.g., simultaneous switching noise) generated within the PCB will also be reduced with implementation of the present invention.

Various embodiments of the invention concern methods of forming a PCB. A single or multilayer PCB substrate may be provided. A hole or multiple holes may be formed in the PCB. In one embodiment, the holes are formed by drilling; however, the scope of embodiments of the subject matter is not limited to drilling, and any suitable process for forming holes can be used, such as punching, microperforation, ablation, laser blasting, etching, and so forth. A lossy material may be applied to the interior of some or all of the holes. In one embodiment of the invention, the lossy material may include carbon. However, as noted above, other lossy materials include, for example, dielectric substances embedded with metal particles.

In addition to the lossy inserts, pads may be formed on the PCB. Vias, such as PTH's, may be formed in each land. In one embodiment, the PTH's may include signal PTH's, ground PTh's, and/or power PTH's. The PTH's may be formed by drilling, punching, microperforation, ablation, laser blasting, etching, or by other methods known to those of ordinary skill in the art.

In addition, an IC package having a plurality of contacts (e.g. solder balls in a ball grid array configuration) may be aligned with respect to the pads on the PCB surface. A heating operation (e.g. a solder reflow operation) may then be carried out in which the balls and pads on the PCB are heated until they electrically and physically join. In one embodiment of the invention, each pad is coupled to a PTH in the PCB. The lands may facilitate coupling between the balls and PTH's.

The power PTH's may be connected to a power source, the ground PTH's may be connected to a ground source, and the signal PTH's may be connected to, for example, I/O signal sources. Power may be transmitted through the power PTH'S. In addition, I/O signals may be transmitted via the signal PTH's. The lossy inserts may act to suppress or eliminate electronic noise (e.g., noise coupling, simultaneous switching noise) in the PCB.

The operations described above (e.g., methods of forming semiconductor packages and PCB's) can be performed in a different order from those described herein. For example, in FIG. 4 the PTH vias could be formed first and the lossy inserts formed afterwards. Furthermore, the PCB discussed can be any type of substrate on which electrical components can be mounted, such as a material formed of polyimide, FR4, silicon, glass, quartz, ceramic, and the like. Further still, an electrical component in the package mounted to the PCB (e.g., FIG. 3) can be of any type, such as an IC or other semiconductor device; a passive element such as an inductor, capacitor, or resistor; or any other kind of electrical or electronic device. If the electrical component in the package is an IC, it can be of any type, such as a microprocessor or microcontroller, memory circuit, application specific integrated circuit (ASIC), digital signal processor (DSP), a radio frequency circuit, an amplifier, a power converter, a filter, a clocking circuit, and the like.

While the present invention has been described with respect to a limited number of embodiments, those of ordinary skill in the art will appreciate numerous modifications and variations there from. It is intended that the appended claims cover all such modifications and variations that fall within the true spirit and scope of the present invention.

What is claimed is:

1. An apparatus comprising:
   a layer in a substrate;
   a via having at least a portion thereof located within the layer; and
   a lossy material insert encapsulated within the layer;
   wherein the lossy material insert is isolated from every additional layer in the substrate.

2. The apparatus of claim 1, wherein the insert is substantially parallel to the via.

3. The apparatus of claim 1, further comprising second and third lossy material inserts; wherein the three lossy material inserts substantially surround the via and the three lossy material inserts are formed in a non-collinear pattern with each other.

4. The apparatus of claim 1, further comprising a second lossy material insert; wherein the second lossy material insert is included in a second layer and a third layer and the second and third layers are included in the substrate.

5. The apparatus of claim 1, wherein the lossy material insert includes a dielectric material.

6. The apparatus of claim 1, wherein the lossy material insert includes carbon.

7. The apparatus of claim 1, wherein the lossy material insert includes a plurality of different lossy materials.

8. The apparatus of claim 1, further comprising a second via; wherein the via is to couple to a power source, the second via is to couple to a signal source, and the lossy material insert is located between the via and the second via.

9. A method comprising:
   forming a via with at least a portion thereof located within a layer of a substrate;
   forming a space within the layer;
   filling at least a portion of the space with a lossy material;
   encapsulating the space within the layer; and
   isolating the space from every additional layer of the substrate.

10. The method of claim 9, further comprising isolating the space from every via located in the layer.

11. The method of claim 9, further comprising isolating the space from every metal layer located in the substrate.

12. The method of claim 9, wherein the layer has a thickness greater than about 200 microns.

13. A method comprising:
   transmitting a signal over a signal path formed in a layer of a substrate; and
   reducing noise, generated in the layer as a result of transmitting the signal, with a lossy material insert encapsulated in the layer;
   wherein the lossy material insert is isolated from every additional layer in the substrate.

14. The method of claim 13, wherein the noise is generated at a frequency greater than about 30 GHz.

15. A system comprising:
   a semiconductor device;
   a motherboard; and
   a package substrate to couple the semiconductor device to the motherboard, the package substrate including a layer, a via with at least a portion thereof located in the layer, and a lossy material insert encapsulated within the layer;
   wherein the lossy material insert is physically isolated from every additional layer in the substrate.

16. The system of claim 15, wherein the lossy material insert does not directly connect to any via in the layer.

17. The system of claim 15, wherein the layer has a thickness between about 200 microns and about 900 microns.

18. The system of claim 15, wherein the lossy material insert does not directly connect to any metal layer located in the substrate.

* * * * *